US009285050B2

(12) United States Patent
Campbell et al.

(10) Patent No.: US 9,285,050 B2
(45) Date of Patent: Mar. 15, 2016

(54) THERMOSTAT-CONTROLLED COOLANT FLOW WITHIN A HEAT SINK

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 421 days.

(21) Appl. No.: 13/783,628

(22) Filed: Mar. 4, 2013

(65) Prior Publication Data
US 2014/0158341 A1    Jun. 12, 2014

Related U.S. Application Data

(63) Continuation of application No. 13/706,557, filed on Dec. 6, 2012.

(51) Int. Cl.
*F16K 31/70*    (2006.01)
*F16K 31/00*    (2006.01)
(Continued)

(52) U.S. Cl.
CPC .............. *F16K 31/002* (2013.01); *F28F 3/12* (2013.01); *F28F 27/00* (2013.01); *F28F 27/02* (2013.01); *H05K 7/20781* (2013.01); *H05K 7/20836* (2013.01)

(58) Field of Classification Search
CPC ............ F28F 3/12; F28F 27/02; F16K 31/002
USPC .................................................. 165/287, 300
See application file for complete search history.

(56) References Cited

U.S. PATENT DOCUMENTS 2,603,420 A * 7/1952 Tacchi ....................... 236/12.18
3,021,688 A * 2/1962 Winfield, Jr. .................. 62/159
(Continued)

OTHER PUBLICATIONS (1952-2012). Alloy Digest—Data on World Wide Metals and Alloys—Lumen Alloy 9 (Manganese Bronze). ASM International.*
(Continued)

*Primary Examiner* — Marc Norman
*Assistant Examiner* — Devon Russell
(74) *Attorney, Agent, or Firm* — Steven Chiu, Esq.; Kevin P. Radigan, Esq.; Heslin Rothenberg Farley & Mesiti P.C.

(57) ABSTRACT

Methods are presented for facilitating dissipation of heat generated by one or more electronic components. The methods include providing a coolant-cooled heat sink and a thermostat-controlled valve. The heat sink includes one or more coolant-carrying channels and one or more valve wells intersecting the channels. The thermostat-controlled valve is disposed, at least partially, within a respective valve well so as to intersect a respective coolant-carrying channel, and includes a valve disk and a thermal-sensitive actuator mechanically coupled to rotate the valve disk. The valve disk is rotatable between an open position where coolant is allowed to flow through the respective coolant-carrying channel, and a closed position where coolant is blocked from flowing through the respective channel. The actuator rotates the valve disk between the open position and the closed position, dependent on heating of the thermal-sensitive actuator by the electronic component(s).

10 Claims, 11 Drawing Sheets

(51) Int. Cl.
  *F28F 27/02* (2006.01)
  *F28F 27/00* (2006.01)
  *F28F 3/12* (2006.01)
  *H05K 7/20* (2006.01)

(56) References Cited

U.S. PATENT DOCUMENTS

| | | | |
|---|---|---|---|
| 3,882,691 A | | 5/1975 | Baines et al. |
| 4,201,735 A | * | 5/1980 | Byam ............... 261/39.6 |
| 4,328,881 A | * | 5/1982 | Rohrer ............. 192/58.683 |
| 4,635,709 A | | 1/1987 | Altoz |
| 4,740,138 A | * | 4/1988 | Zaehring et al. ........... 415/12 |
| 5,186,385 A | * | 2/1993 | Karabin et al. ........... 236/1 G |
| 5,193,780 A | * | 3/1993 | Franklin .................. 251/68 |
| 5,603,344 A | * | 2/1997 | Hall, Jr. ..................... 137/2 |
| 6,499,535 B2 | | 12/2002 | Cowans |
| 7,104,312 B2 | | 9/2006 | Goodson et al. |
| 7,347,060 B2 | | 3/2008 | Krempel |
| 7,751,188 B1 | | 7/2010 | French et al. |
| 7,757,506 B2 | | 7/2010 | Ellsworth, Jr. et al. |
| 7,963,119 B2 | | 6/2011 | Campbell et al. |
| 8,107,234 B2 | | 1/2012 | Brunschwiler et al. |
| 8,151,872 B2 | | 4/2012 | DiStefano |
| 8,978,993 B1 | * | 3/2015 | Romero ................. 236/93 R |
| 2009/0200007 A1 | * | 8/2009 | Foy et al. ................. 165/287 |
| 2011/0210179 A1 | * | 9/2011 | Moser et al. ............ 236/93 R |
| 2012/0312510 A1 | * | 12/2012 | Eckberg et al. ......... 165/104.33 |
| 2014/0158339 A1 | | 6/2014 | Campbell et al. |

OTHER PUBLICATIONS

Anonymous, "Method for Thermoelectrical Codesign of On-Demand Microchannel Cooling for Multicore Microprocessors", IP.com Prior Art Database Disclosure (Source: IPCOM), Disclosure No. IPCOM000136960D dated Jun. 5, 2006, 5 pages.

Campbell, et al., "Thermostat-Controlled Coolant Flow Within a Heat Sink", U.S. Appl. No. 13/706,557, filed Dec. 6, 2012.

Campbell et al., Office Action for U.S. Appl. No. 13/706,557, filed Dec. 6, 2012 (U.S. Patent Publication No. 2014/0158339 A1), dated Jun. 19, 2015 (12 pages).

* cited by examiner

THERMOSTAT-CONTROLLED COOLANT FLOW WITHIN A HEAT SINK

CROSS REFERENCE TO RELATED APPLICATION

This application is a continuation of U.S. Ser. No. 13/706,557, filed Dec. 6, 2012, and entitled "Thermostat-Controlled Coolant Flow Within A Heat Sink", and which is hereby incorporated herein by reference in its entirety.

BACKGROUND

The power dissipation of integrated circuit chips, and the modules containing the chips, continues to increase to facilitate continued increasing in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

In one aspect, a method is provided which includes: providing a coolant-cooled heat sink, the coolant-cooled heat sink being configured to facilitate dissipation of heat generated by one or more electronic components, and comprising a coolant-carrying channel and a valve well intersecting the coolant-carrying channel; and providing a thermostat-controlled valve disposed, at least partially, within the valve well and intersecting the coolant-carrying channel. The thermostat-controlled valve includes: a valve disk rotatable between an open position, where coolant is allowed to flow through the coolant-carrying channel, and a closed position where coolant is blocked from flowing through the coolant-carrying channel; and a thermal-sensitive actuator mechanically coupled to rotate the valve disk between the open position and the closed position, dependent on heating of the thermal-sensitive actuator by the one or more electronic components.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
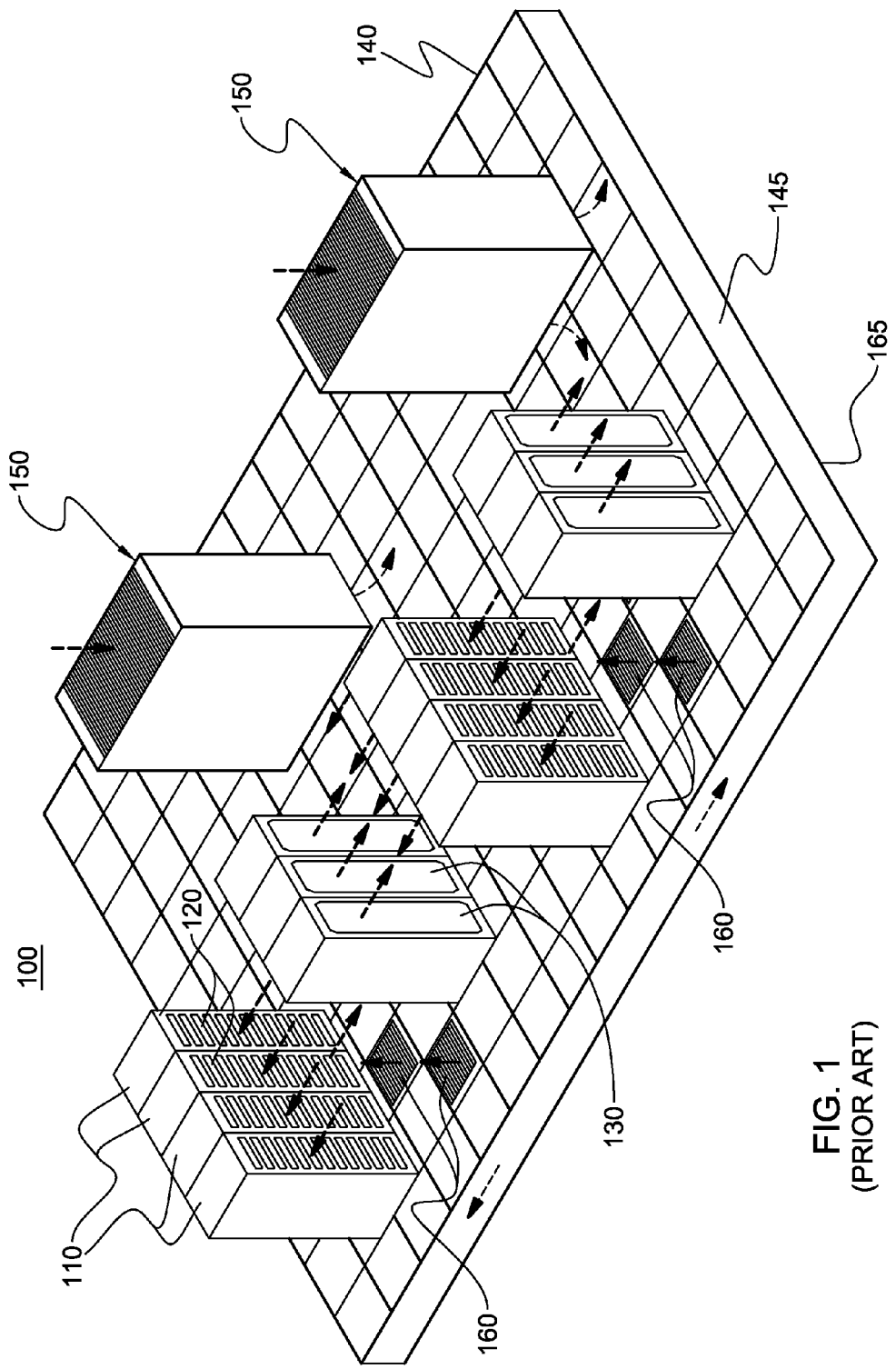
FIG. 1 depicts one embodiment of a conventional raised floor layout of an air-cooled data center.

As used herein, the terms "electronics rack", "rack", and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" or "component" refers to any heat generating component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", or "coolant-cooled cold plate" refer to any thermally conductive structure having one or more channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings (which are not drawn to scale to facilitate an understanding of the various aspects of the present invention), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
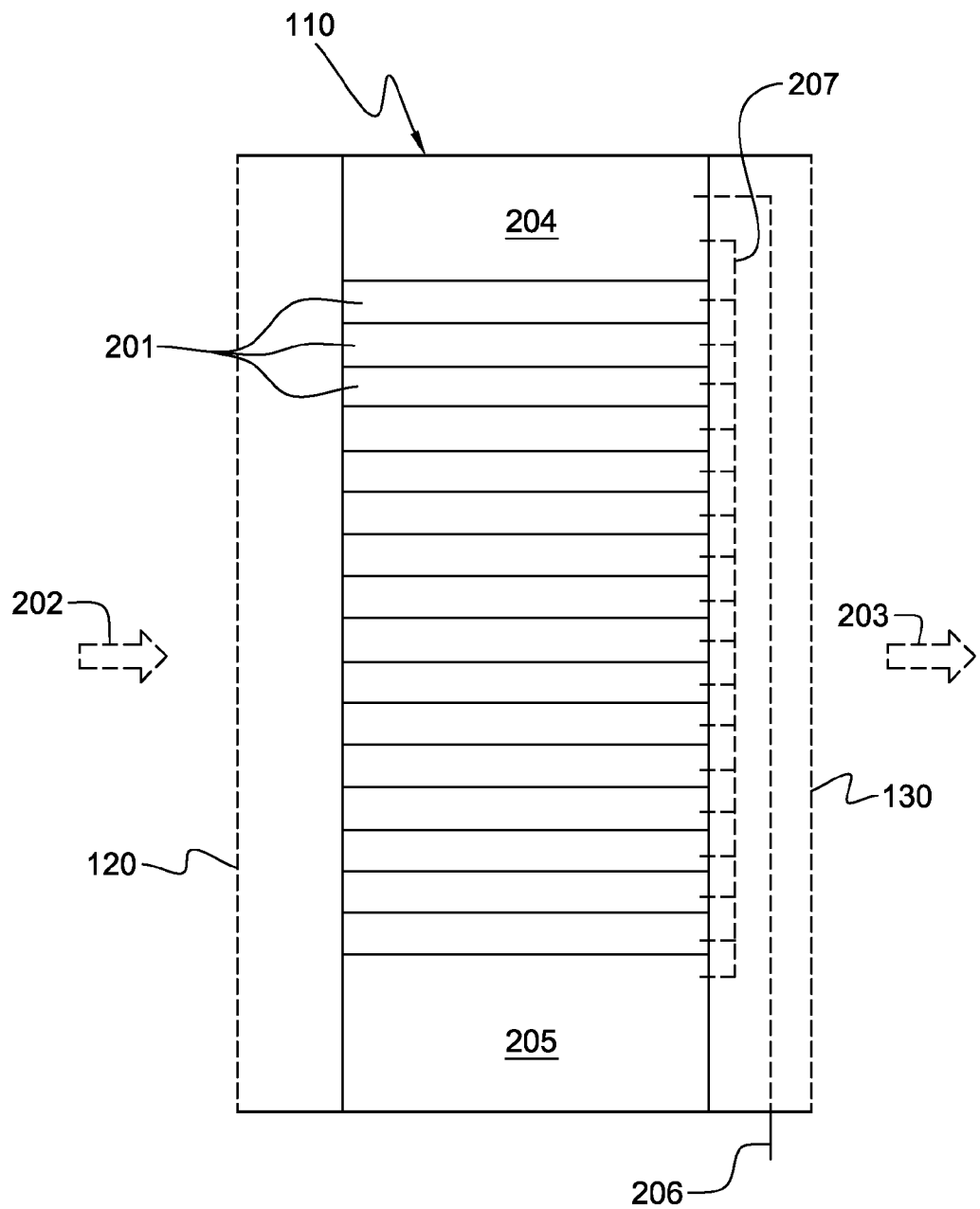
FIG. 2 is a cross-sectional elevational view of one embodiment of an electronics rack comprising multiple air-cooled electronic systems, one or more of which may be modified to include a cooling apparatus, in accordance with one or more aspects of the present invention.

FIG. 2 is an elevational representation of one embodiment of an electronics rack 110, shown comprising a plurality of electronic systems 201, which (in the embodiment illustrated), are a least partially air-cooled by cool air 202 ingressing via louvered air inlet side 120, and exhausting out louvered air outlet side 130 as hot air 203. Electronics rack 110 also includes one or more bulk power assemblies 204; for instance, one or more AC-to-DC power supply assemblies. The AC-to-DC power supply assemblies may include, in one embodiment, a frame controller, which may be resident in bulk power assembly 204 and/or in one or more electronic systems 201. Each electronic system 201 includes, in one example, one or more processors and associated memory. Also illustrated in FIG. 2 is one or more input/output (I/O) drawer(s) 205, which may also include a switch network. I/O drawer(s) 205 may include, for example, PCI card slots and disk drivers for the electronics rack.

A three-phase AC source feeds power via an AC power supply line cord 206 to bulk power assembly 204, which transforms the supplied AC power to an appropriate DC power level for output via distribution cable 207 to the plurality of electronic systems 201 and I/O drawer(s) 205. The number of electronic systems installed in the electronics rack is variable and depends on customer requirements for a particular system. Further, the configuration of the bulk power assembly is variable and may be determined, in one implementation, by the number of electronic systems installed in the electronics rack, or more particularly, by the power requirements of the common load of the electronics rack being fed by the power assembly.

Figure 3:
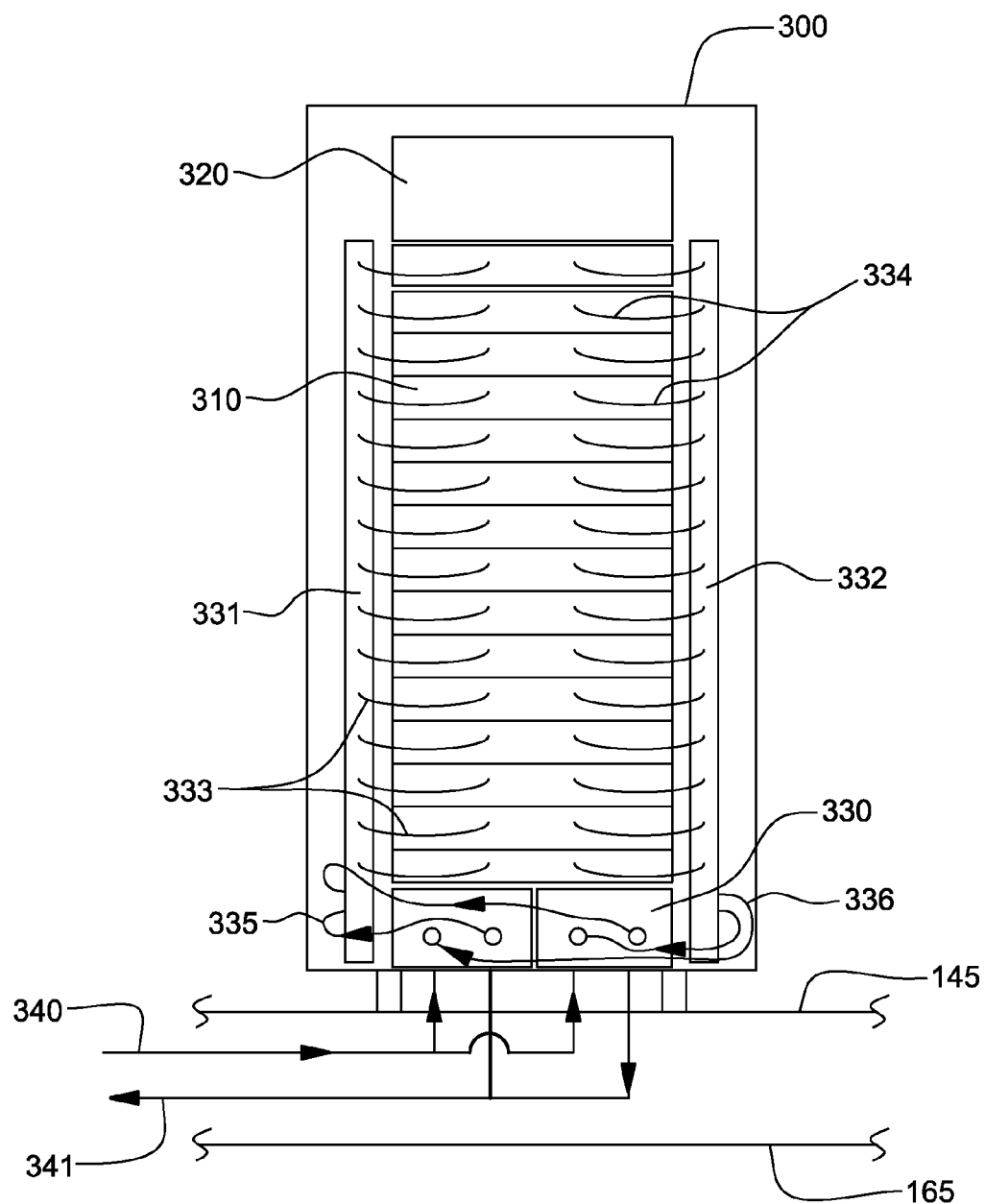
FIG. 3 is a front elevational view of one embodiment of a liquid-cooled electronics rack comprising multiple electronic systems, which may be cooled, at least in part, by a cooling apparatus, in accordance with one or more aspects of the present invention.

FIG. 3 depicts one embodiment of a liquid-cooled electronics rack 300 comprising a cooling apparatus, such as a cooling apparatus disclosed herein. In one embodiment, liquid-cooled electronics rack 300 comprises a plurality of electronic systems 310, which may be processor or server nodes (in one embodiment). A bulk power assembly 320 is disposed at an upper portion of liquid-cooled electronics rack 300, and two modular cooling units (MCUs) 330 are positioned in a lower portion of the liquid-cooled electronics rack for providing system coolant to the electronic systems. In the embodiments described herein, the system coolant is assumed to be water or an aqueous-based solution, by way of example only.

In addition to MCUs 330, the cooling apparatus depicted includes a system coolant supply manifold 331, a system coolant return manifold 332, and manifold-to-node fluid connect hoses 333 coupling system coolant supply manifold 331 to electronic subsystems 310 (for example, to cold plates disposed within the systems) and node-to-manifold fluid connect hoses 334 coupling the individual electronic systems 310 to system coolant return manifold 332. Each MCU 330 is in fluid communication with system coolant supply manifold 331 via a respective system coolant supply hose 335, and each MCU 330 is in fluid communication with system coolant return manifold 332 via a respective system coolant return hose 336.

Heat load of the electronic systems 310 is transferred from the system coolant to cooler facility coolant within the MCUs 330 provided via facility coolant supply line 340 and facility coolant return line 341 disposed, in the illustrated embodiment, in the space between raised floor 145 and base floor 165.

Figure 4:
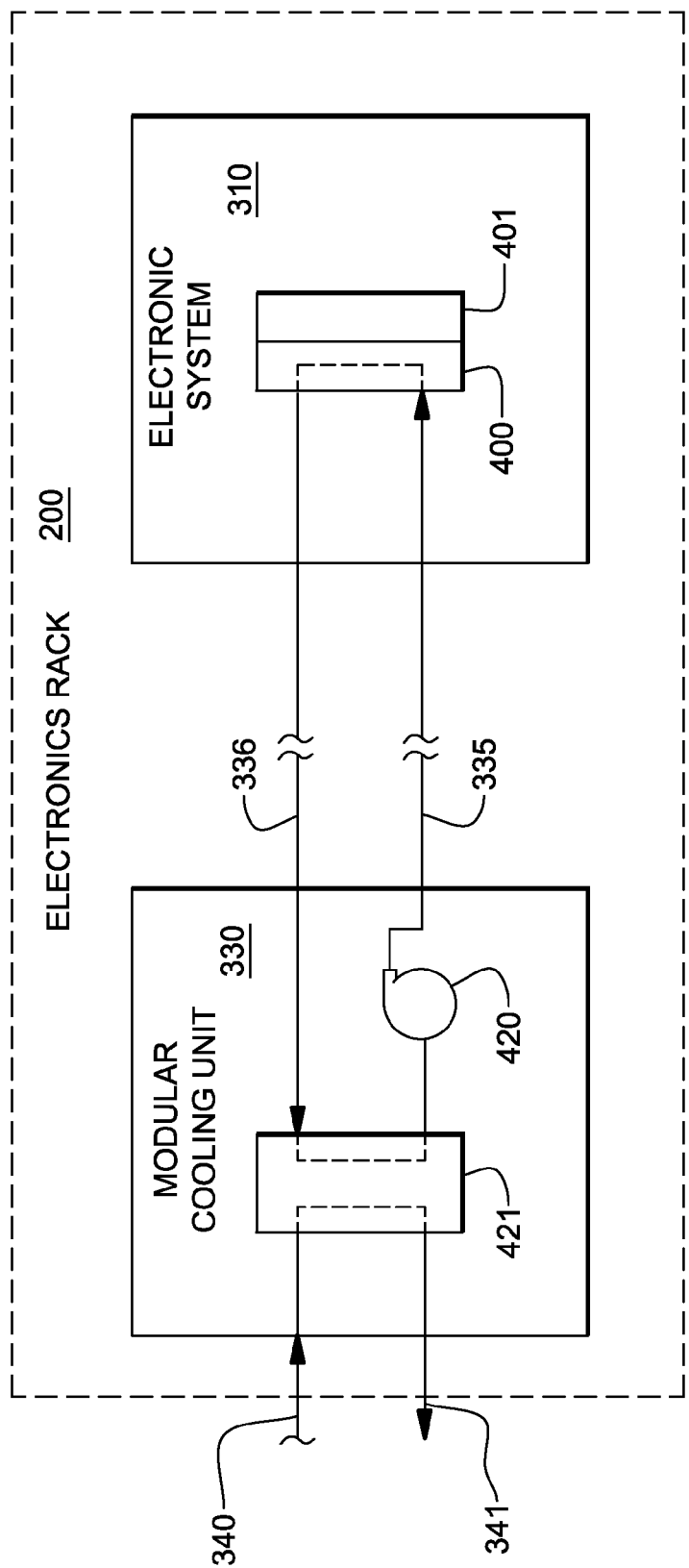
FIG. 4 is a schematic of one embodiment of an electronic system of an electronics rack and one approach to liquid-cooling of one or more electronic components within the electronic system, wherein the one or more electronic components are indirectly liquid-cooled by system coolant provided via one or more modular cooling units, for instance, disposed within the electronics rack, in accordance with one or more aspects of the present invention.

FIG. 4 schematically illustrates one cooling approach using the cooling apparatus of FIG. 3, wherein a liquid-cooled cold plate 400 is shown coupled to an electronic component 401 of an electronic system 310 within the liquid-cooled electronics rack 300. Heat is removed from electronic component 401 via system coolant circulating via pump 420 through liquid-cooled cold plate 400 within the system coolant loop defined, in part, by liquid-to-liquid heat exchanger 421 of modular cooling unit 330, hoses 335, 336 and cold plate 400. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 340, 341, to which heat is ultimately transferred.

Figure 5:
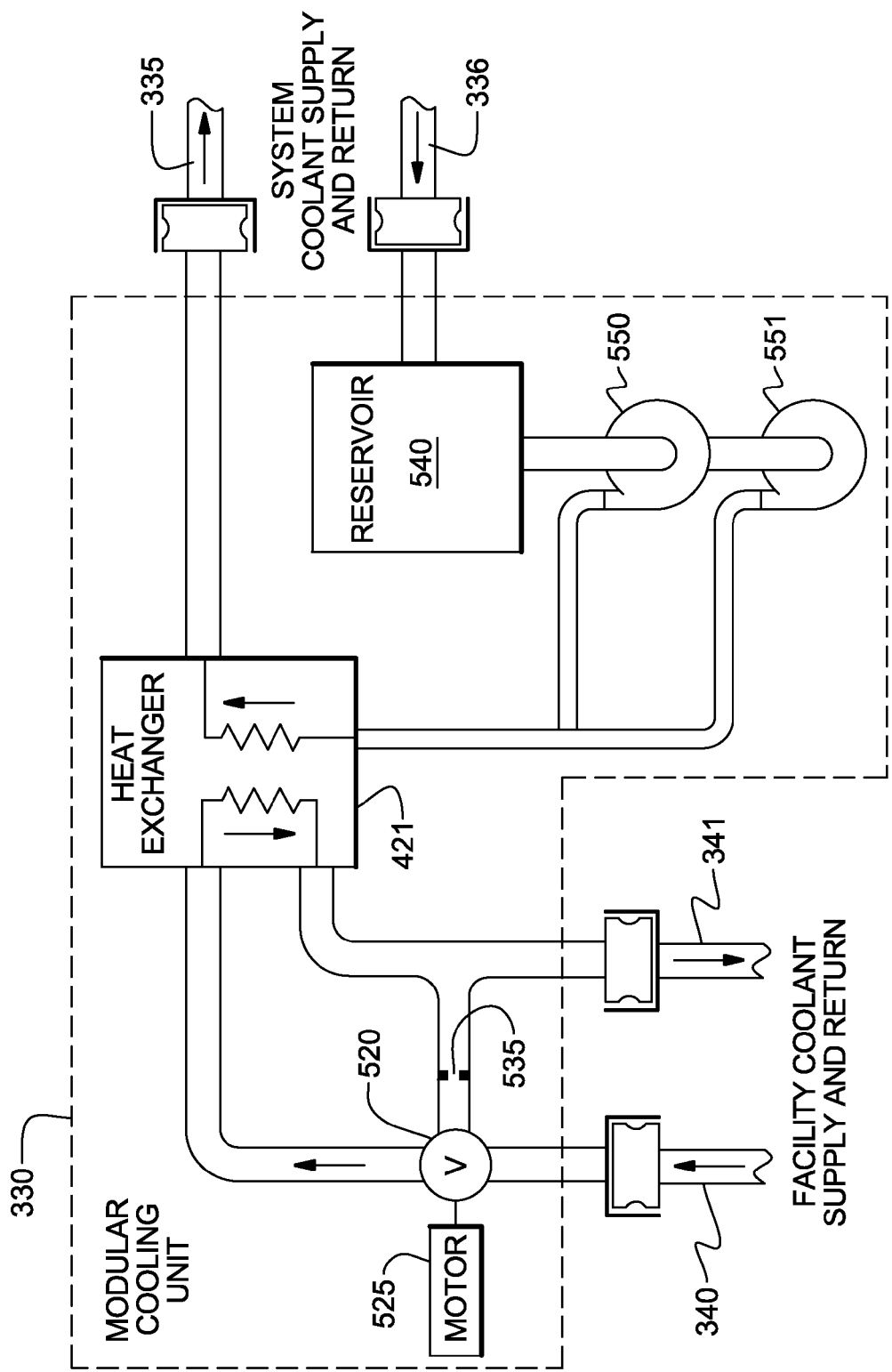
FIG. 5 is a schematic of one embodiment of a modular cooling unit for a liquid-cooled electronics rack such as illustrated in FIGS. 3 & 4, in accordance with one or more aspects of the present invention.

FIG. 5 depicts a more detailed embodiment of a modular cooling unit 330. As shown in FIG. 5, modular cooling unit 330 includes a facility coolant loop, wherein building chilled, facility coolant is provided (via lines 340, 341) and passed through a control valve 520 driven by a motor 525. Valve 520 determines an amount of facility coolant to be passed through heat exchanger 421, with a portion of the facility coolant possibly being returned directly via a bypass orifice 535. The modular cooling unit further includes a system coolant loop with a coolant reservoir 540 from which system coolant is pumped, either by pump 550 or pump 551, into liquid-to-liquid heat exchanger 421 for conditioning and output thereof, as cooled system coolant to the electronics rack to be cooled. Each modular cooling unit is coupled to the system supply manifold and system return manifold of the liquid-cooled electronics rack via the system coolant supply hose 335 and system coolant return hose 336, respectively.

As noted above, as component density within electronic systems (such as servers) continues to increase to achieve increased performance, heat generated by these more densely-packed components may necessitate liquid cooling of the components in certain cases. As increasingly more electronic component heat load is dissipated employing, for instance, coolant-cooled cold plates or heat sinks, the total liquid flow rate at the electronic system level, and at the electronics rack level, increases. Energy efficiency is an important consideration for electronics rack and electronic system designs, whether air-cooled or liquid-cooled, and increased coolant flow rates within a rack or system increase the energy used of the cooling system. To address this issue, the cooled electronic systems and cooling apparatuses described herein incorporate thermostat-controlled valves, which independently implement analog flow rate control based on heat dissipated by one or more associated electronic components. The valves dynamically adjust (e.g., minimize) coolant flow required by the cooling system(s). Advantageously, the thermostat-controlled valves disclosed herein are analog in nature, and do not require any active sensor-based technology, which necessarily would introduce complexity and possible failure modes, resulting in lower reliability than the analog or passive valves presented.

Generally stated, disclosed herein is a cooled electronic system, and cooling apparatus, which includes (for instance) a coolant-cooled heat sink and one or more thermostat-controlled valves. The coolant-cooled heat sink facilitates dissipation of heat generated by one or more electronic components, and includes one or more coolant-carrying channels and one or more valve wells intersecting the one or more coolant-carrying channels. The thermostat-controlled valve(s), which is disposed, at least partially, within a respective valve well in the heat sink, and intersects a respective coolant-carrying channel, includes a valve disk and a thermal-sensitive actuator mechanically coupled to rotate the valve disk. The valve disk is rotatable between an open position, where coolant is allowed to flow across the valve disk and through the coolant-carrying channel, and a closed position, where coolant is blocked from flowing across the valve disk and through the coolant-carrying channel. The thermal-sensitive actuator mechanically, incrementally rotates the valve disk between the open position and the closed position, dependent on heating of the thermal-sensitive actuator by the one or more electronic components.

More particularly, disclosed herein, in one aspect, is an at least partially liquid or coolant-cooled electronic system or assembly, wherein one or more electronic components are thermally coupled to a coolant-cooled heat sink, such as a cold plate base of the heat sink. The electronic component(s) is cooled by conduction of heat from the component through the cold plate base to coolant flowing through one or more coolant-carrying channels within the heat sink. Where multiple coolant-carrying channels are provided within the heat sink, the channels may be parallel coolant flow channels disposed to cool the cold plate (for instance, the cold plate base) in the vicinity of the electronic components to be cooled. At least one of the coolant-carrying channels, and in a specific embodiment, each of the coolant-carrying channels, has an associated thermostat-controlled valve disposed within a valve well which intersects that coolant-carrying channel. The thermostat-controlled valve autonomously, independently controls coolant flow through the associated coolant-carrying channel(s) of the coolant-cooled heat sink. In one embodiment, the thermostat-controlled valve includes: a valve disk rotatable between an open position and a closed position; and a thermal-sensitive actuator mechanically coupled to rotate the valve disk, such as a coiled actuator attached at one end to the coolant-cooled heat sink, and at another end to the valve disk.

In one embodiment, the one or more coolant-carrying channels are designed to align, at least partially, over one or more electronic components to be cooled, and each coolant-carrying channel may have an associated thermostat-controlled valve intersecting therewith and disposed, in one embodiment, within a respective valve well in the coolant-cooled heat sink over (or in close proximity to) the electronic component(s) being cooled.

In one implementation, the valve disk comprises a coolant channel that extends thereacross, and in the open position, the coolant channel substantially aligns to an axis of the respective coolant-carrying channel of the coolant-cooled heat sink, and in the closed position, the coolant channel of the valve disk is rotated away from and misaligned to the axis of the respective coolant-carrying channel of the coolant-cooled heat sink. Where there are multiple valves for multiple coolant-carrying channels, the thermostat-controlled valves are independent points of control, and the associated valve disks are automatically, passively incrementally adjusted between the open and closed positions, dependent on temperature of the associated thermal-sensitive actuator that is mechanically coupled to rotate the particular valve disk.

As temperature of the associated electronic component(s) increases, the valve disk and thermal-sensitive actuator operate to automatically increase the coolant flow cross-sectional opening through the thermostat-controlled valve relative to the coolant-carrying channel of the heat sink; and as component temperature decreases, to automatically, passively reduce, and ultimately close off coolant flow, across the thermostat-controlled valve, and thus through the channel. In one embodiment, the thermal-sensitive actuator comprises a coiled actuator made of a length of thermally conductive material with a relatively high coefficient of thermal expansion (CTE), for instance, >20 microns per meter Kelvin. The coiled actuator expands or contracts as the component temperature changes, causing the valve disk to rotate and autonomously, passively adjust the coolant flow cross-sectional opening (i.e., flow passageway size) relative to the coolant-carrying channel, and thus adjust the coolant flow across the thermostat-controlled valve to allow increased or decreased coolant flow through the coolant-carrying channel, based on heat load of the associated electronic component(s).

In one specific embodiment, the coiled actuator comprises a manganese-bronze foil of length 1 meter or greater, which increases in length responsive to increased temperature (governed by the material property's CTE), and decreases in length responsive to decreased temperature. The coiled actuator has one end, for instance, an outer end, mechanically coupled or attached to the cold plate base at the outer diameter of the coiled actuator (i.e., at the largest coil), and another end, for instance an inner end mechanically coupled or attached to the valve disk at the inner diameter of the coiled actuator (e.g., at the smallest coil), such that a change in foil length responsive to temperature causes a relative rotation of the disk, and the associated coolant channel of the disk relative to the coolant-carrying channel of the cold plate base rotates, thereby controlling the coolant flow cross-sectional opening at the thermostat-controlled valve relative to the coolant-carrying channel. The valve disk and thermal-sensitive actuator are disposed, in one embodiment, within the cold plate base within a valve well (or recess) which intersects the coolant-carrying channel, and is closely sized to the outer diameter of the coiled actuator. In other embodiments, different coiled actuator materials may be employed. For instance, beryllium-copper-25 might be used. The actuator material is, in one embodiment, a metal, since the cooling of the component under the thermostat will be a function of the thermal conductivity of the actuator material. In alternate arrangements, where (for instance) the component is roughly the size of a valve spindle, or where a larger valve is created such that the component heat load can travel through the valve disk without disruption from the actuator, higher CTE materials, such as polymers, could be considered. One possible polymer might comprise nylon.

By way of example only, FIGS. 6A-6I depict one detailed embodiment of a cooled electronic system, and cooling apparatus, in accordance with one or more aspects of the present invention.

Figure 6A:
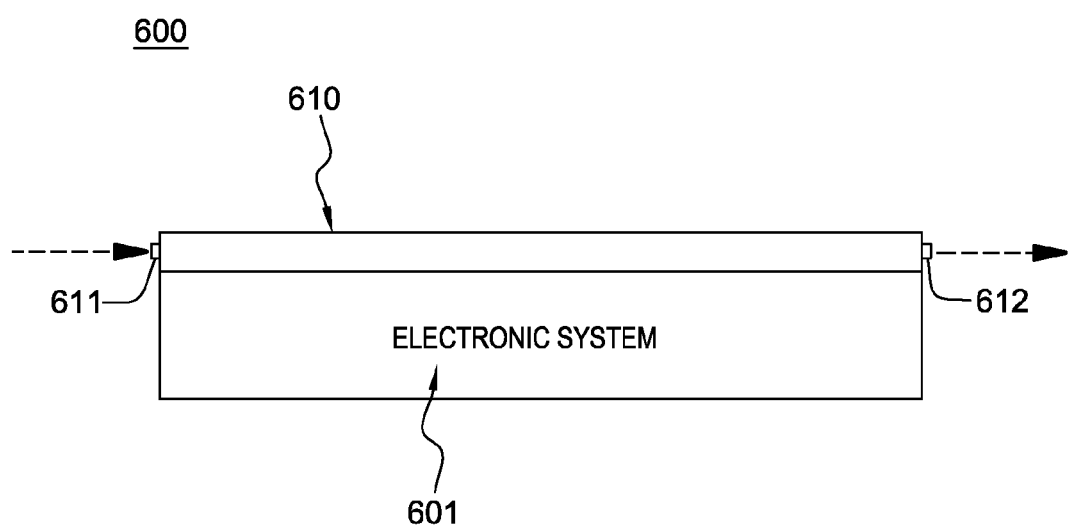
FIG. 6A is a schematic of one embodiment of a cooled electronic system comprising a cooling apparatus, which includes a thermostat-controlled, coolant-cooled heat sink coupled to one or more electronic components to be cooled, in accordance with one or more aspects of the present invention.

Referring to FIG. 6A, a schematic of one embodiment of a cooled electronic system, generally denoted 600, is illustrated. Cooled electronic system 600 includes an electronic system 601, comprising one or more electronic components (not shown) and a coolant-cooled heat sink 610 coupled to the electronic system 601. Coolant-cooled heat sink 610 includes a coolant inlet 611 and a coolant outlet 612 for facilitating the passage of a coolant, such as the above-described system coolant, therethrough. As discussed below, coolant-cooled heat sink 610 includes one or more coolant-carrying channels which, in accordance with one or more aspects of the present invention, have associated therewith one or more thermostat-controlled valves configured to automatically manipulate the coolant flow passageway through the valve relative to the coolant-carrying channel, and thus coolant flow through the coolant-carrying channel of the heat sink, based on heat being dissipated by the one or more electronic components to which the thermostat-controlled valve is coupled via, for instance, thermal conduction.

Figure 6B:
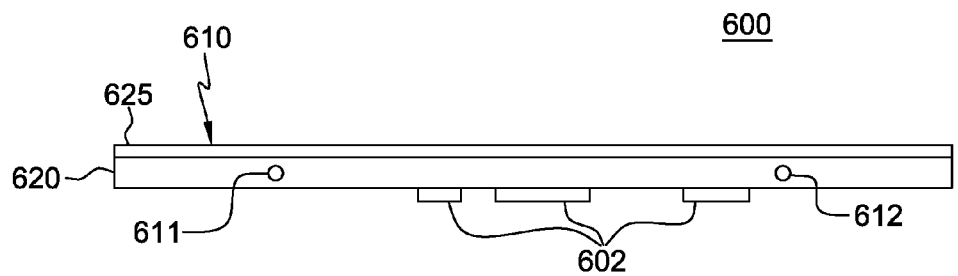
FIG. 6B is an elevational view of a more detailed embodiment of a cooled electronic system comprising a cooling apparatus, in accordance with one or more aspects of the present invention.

FIG. 6B depicts an elevational view of a more specific embodiment of a cooled electronic system 600, comprising a coolant-cooled heat sink 610 in thermal communication with multiple electronic components 602 to be cooled. As illustrated, coolant-cooled heat sink 610 includes a cold plate base 620 and a cover 625. In one implementation, cold plate base 620 and cover 625 are each fabricated of a thermally conductive material, such as a metal. As illustrated in the plan view of FIG. 6C, cold plate base 620 may comprise (in one embodiment) a coolant inlet manifold 621 and a coolant outlet manifold 622 in fluid communication with coolant inlet 611 and coolant outlet 612, respectively. At least one, and in the illustrated embodiment, multiple coolant-carrying channels 623 are provided in the base plate which define parallel coolant flow paths between coolant inlet manifold 621 and coolant outlet manifold 622.

Figure 6C:
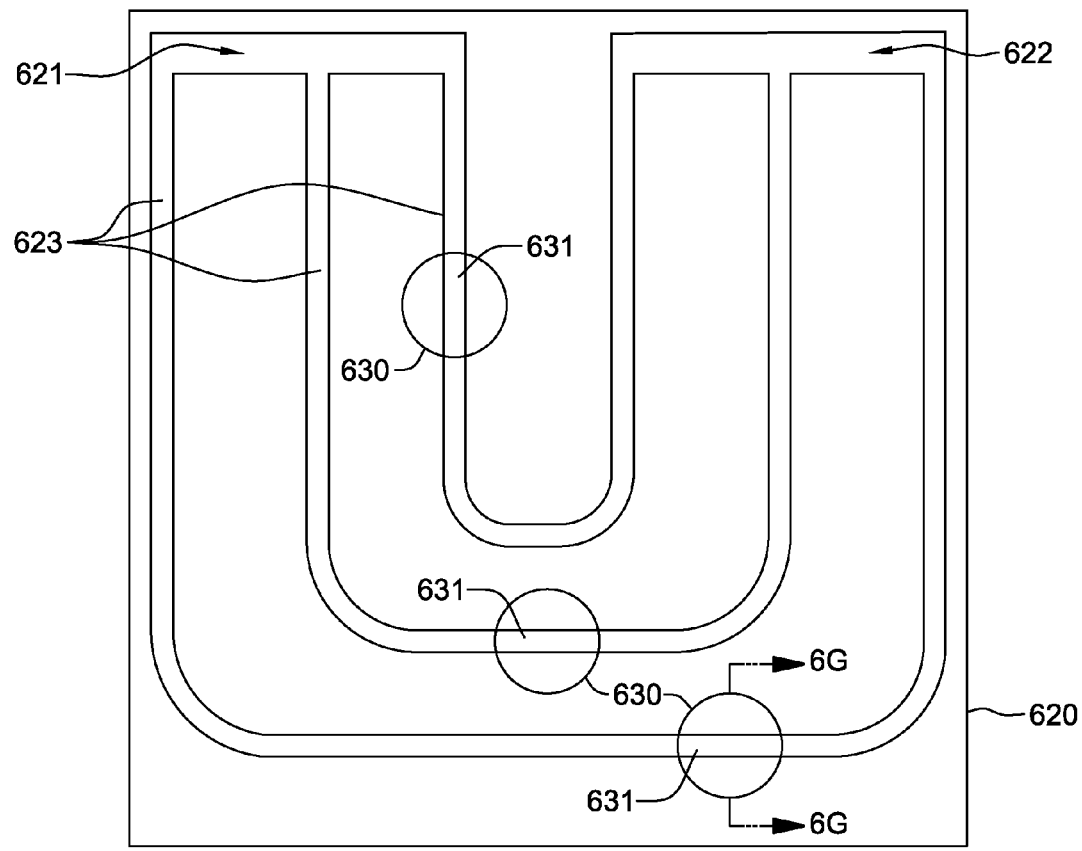
FIG. 6C is a plan view of one embodiment of the cold plate base of the thermostat-controlled, coolant-cooled heat sink of the cooling apparatus of FIG. 6B, in accordance with one or more aspects of the present invention.

In the embodiment of FIG. 6C, multiple thermostat-controlled valves 630 are disposed, at least partially, within respective valve wells 624 (see FIG. 6D) defined within, for instance, cold plate base 620 of coolant-cooled heat sink 610. In the depicted embodiment, each valve well has an associated thermostat-controlled valve disposed (at least partially) therein so as to intersect the respective coolant-carrying channel. Note, however, that this embodiment is provided by way of example only. More or less than three (3) coolant-carrying channels may be defined within the heat sink, any one of which may have associated therewith a thermostat-controlled valve, such as described herein, to control the coolant flow through that coolant-carrying channel. For instance, in a heat sink comprising a plurality of coolant-carrying channels, one or more may have a respective intersecting valve well and associated thermostat-controlled valve disposed therein. Thus, certain coolant-carrying channels may have automated flow control as described herein, while others may lack automated flow control, depending on the implementation. The embodiment depicted herein is particularly advantageous in a low-power environment, where the thermostat-controlled valves automatically shut off substantially all coolant flow through the heat sink, thereby enhancing energy efficiency by allowing for reduced pumping of coolant within the electronics rack or system.

Figure 6D:
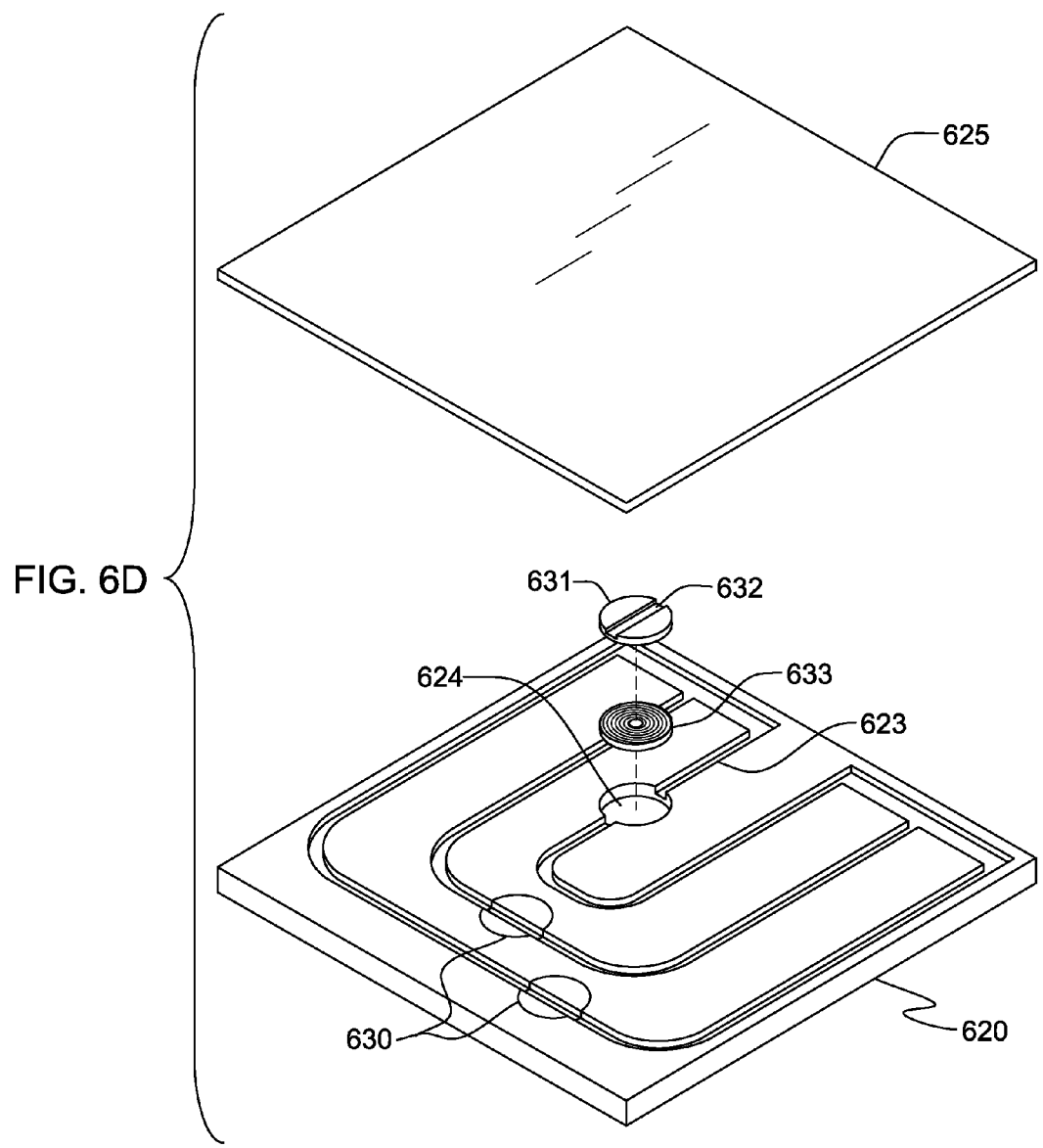
FIG. 6D is a partially exploded view of the cooling apparatus embodiment of FIGS. 6B-6C, in accordance with one or more aspects of the present invention.

As illustrated in the partially exploded view of FIG. 6D, thermostat-controlled valve 630 includes, in one embodiment, a valve disk 631 and a thermal-sensitive actuator 633 mechanically coupled to rotate valve disk 631 based upon, for instance, temperature of one or more associated electronic components (see FIG. 6B) thermally coupled to cold plate base 620. Valve disks 631 each include a coolant channel 632, which may have a similar or different cross-sectional flow area as the associated and intersected coolant-carrying channel 623 in cold plate base 620. Rotational orientation of valve disk 631, and thus coolant channel 632, is controlled via thermal-sensitive actuator 633, which in one embodiment is a coiled actuator comprising a coiled length of material with a high coefficient of thermal expansion. For instance, a coil of copper or a manganese-bronze alloy foil could be employed. One end of the coil is affixed to the cold plate base, and the other end is affixed to the valve disk. With changing temperature, the coiled actuator experiences either an increasing or decreasing in length proportional to the product of its coefficient of thermal expansion (CTE), original length, and the temperature change, which causes relative motion between the valve disk and heat sink base, and causes the flow channel cross-sectional opening relative to the respective coolant-carrying channel in the heat sink base to vary.

Figure 6E:
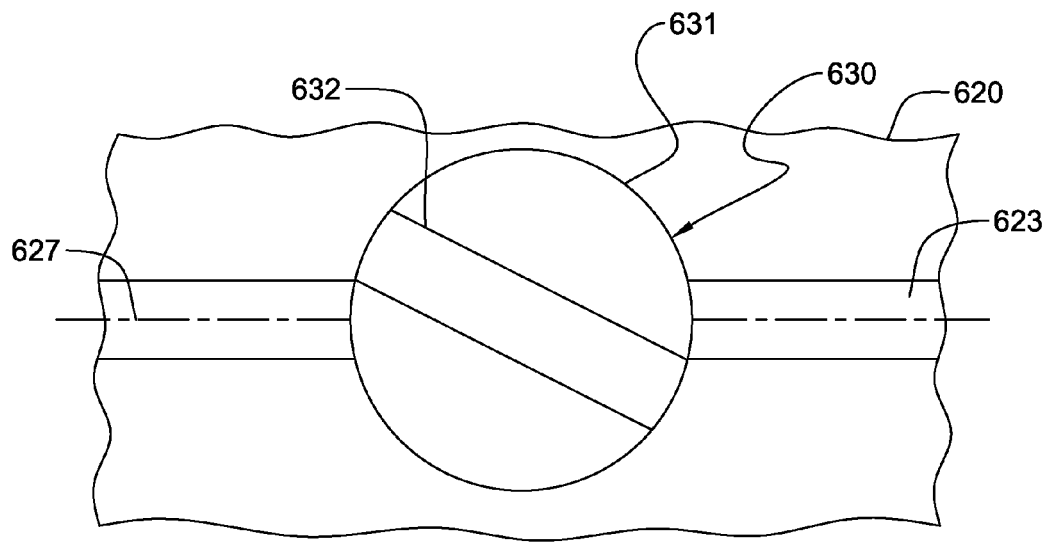
FIG. 6E is a partial plan view of one thermostat-controlled valve intersecting a coolant-carrying channel of the cold plate base of FIGS. 6C & 6D, with the valve shown in a fully closed position, in accordance with one or more aspects of the present invention.
Figure 6F:
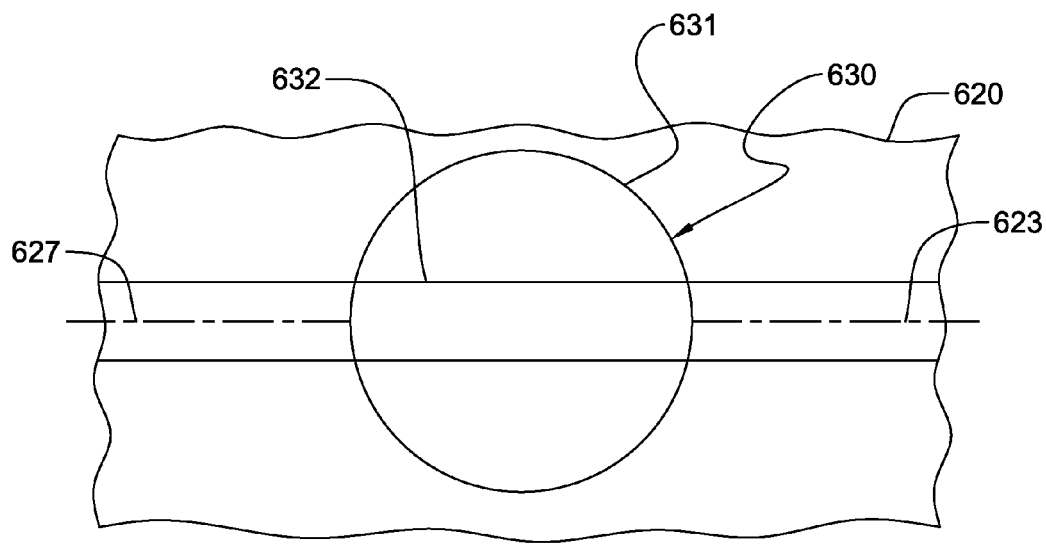
FIG. 6F depicts the thermostat-controlled valve of FIG. 6E, with the valve shown in a fully open position, in accordance with one or more aspects of the present invention.

As illustrated in FIG. 6E, when thermostat-controlled valve's 630 associated electronic component(s) (not shown) temperature is well below typical operating temperature, for example, 25° C., the coolant channel 632 of valve disk 631 is rotated away from the axis 627 of the associated coolant-carrying channel 623, which (in the depicted example) disallows coolant flow through coolant-carrying channel 623. Conversely, when the electronic component(s) temperature is at or above a typical operating temperature (for example, 75° C.), then the coolant channel 632 in valve disk 631 substantially aligns with the center axis 627 of coolant-carrying channel 623 in cold plate base 620. This alignment allows coolant flow to pass across the thermostat-controlled valve, and thus, through the associated coolant-carrying channel, thereby assisting in cooling the one or more associated electronic components thermally coupled to the heat sink. Note that in this example, there is a continuum of positions that valve disk 631 may occupy between the closed position illustrated in FIG. 6E and the open position illustrated in FIG. 6F. That is, dependent on the temperature of the one or more associated electronic components, valve disk 631 may be only partially rotated away from axis 627 of the associated coolant-carrying channel 623, in which case, partial coolant flow across the thermostat-controlled valve 630 may occur, allowing for some liquid-based cooling of the one or more associated electronic components. The thermostat-controlled valve disclosed herein is an autonomous, analog (i.e., passive) implementation, wherein the valve itself inherently adjusts along a continuum between closed and opened, and the rotational orientation of the valve disk automatically controls the cross-sectional coolant flow opening or area presented by the valve disk relative to the coolant-carrying channel.

Figure 6G:
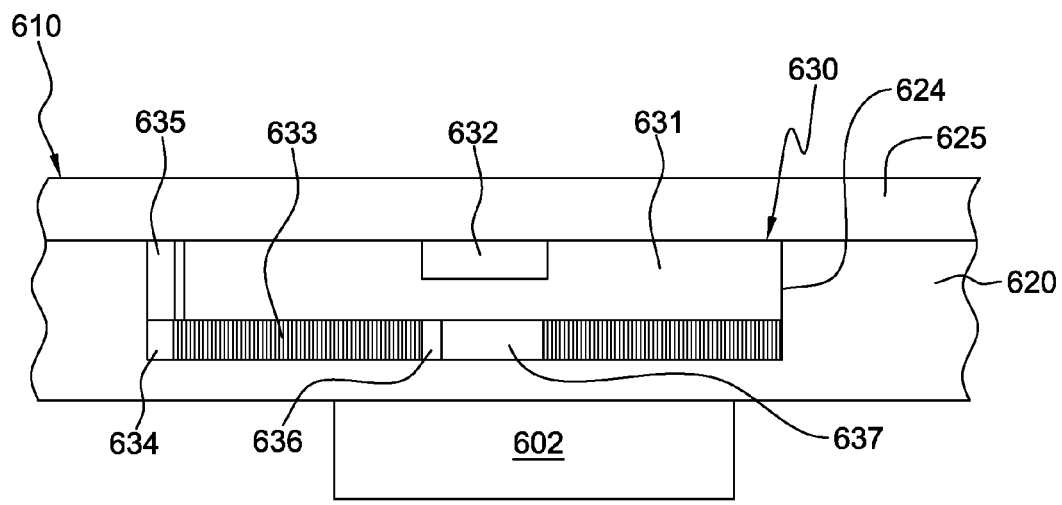
FIG. 6G is a partial cross-sectional elevational view of the cooling apparatus of FIG. 6C, taken along line 6G-6G thereof, in accordance with one or more aspects of the present invention.
Figure 6H:
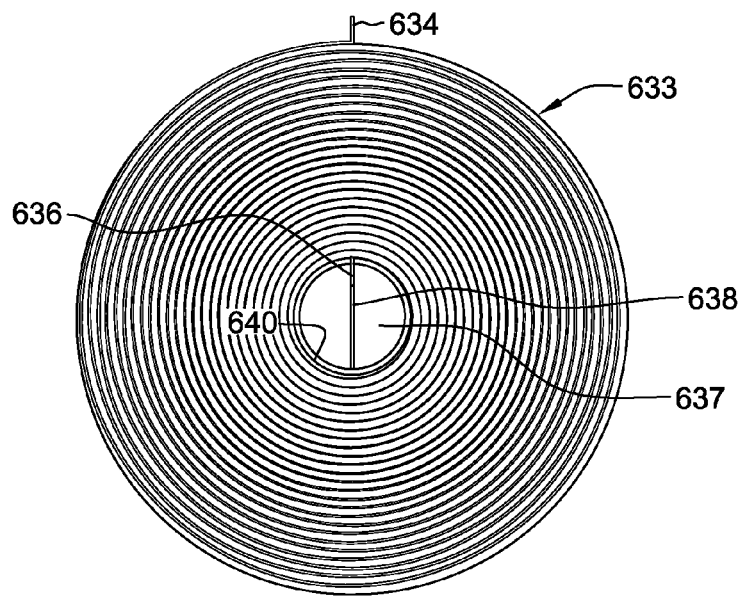
FIG. 6H is a bottom plan view of one embodiment of the thermostat-controlled valve of the cooling apparatus of FIGS. 6B-6G, showing one implementation of the thermal-sensitive actuator, and a portion of the valve disk of the thermostat-controlled valve, in accordance with one or more aspects of the present invention.
Figure 6I:
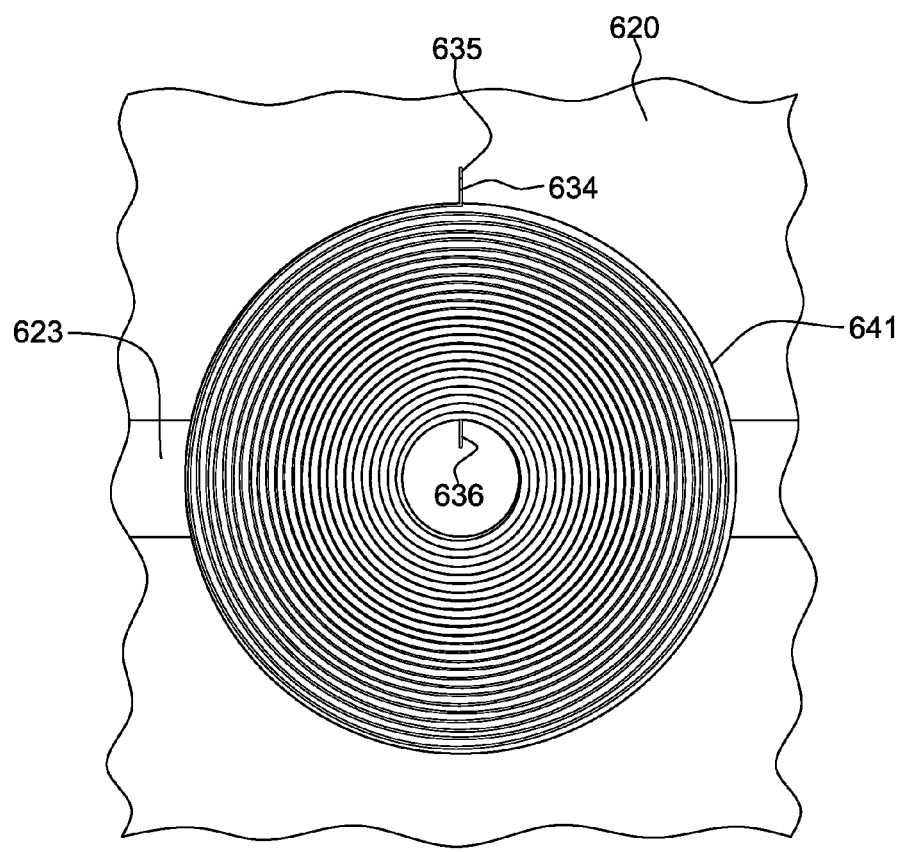
FIG. 6I is a top plan view of one embodiment of the thermal-sensitive actuator of FIG. 6H, shown positioned within a respective valve well of the cold plate base of the coolant-controlled heat sink, in accordance with one or more aspects of the present invention.

As illustrated in the cross-sectional elevational view of FIG. 6G, coolant-cooled heat sink 610 includes a valve well 624 (or pocket) in cold plate base 620, within which a respective thermostat-controlled valve 630 is disposed. The valve well, and thus the thermostat-controlled valve, is positioned within the cold plate base so as to be aligned, in one example, over one or more electronic components 602 to be cooled. The valve wells (or pockets) are each sized and configured to house a respective thermostat-controlled valve, which in the embodiment described herein, includes a valve disk 631 and an associated thermal-sensitive actuator 633. As illustrated in FIG. 6G, valve disk 631 includes a coolant channel 632, which aligns, or partially or fully misaligns, with the central axis of the respective coolant-carrying channel with which the thermostat-controlled valve is associated, dependent on heat being generated by the underlying electronic component(s) 602. The valve well is sized and the thermal-sensitive actuator is mechanically coupled to rotate valve disk 631. For instance, as illustrated in FIGS. 6H & 6I, one end 636 at an inner diameter 640 of the coiled actuator 633 may be disposed within a slot 638 in a central portion 637 of disk valve 631. As illustrated, this central portion extends into the central opening in the coiled, thermal-sensitive actuator 633. Note also that, as illustrated in FIG. 6H, the central portion 637 of valve disk 631 is spaced from the inner coil 640 of the coiled actuator 633.

Similarly, as illustrated in FIGS. 6G & 6I, the outer diameter 641 of coiled actuator 633 may comprise an end, such as a tab, 634 which resides in a slot 635, or is otherwise secured or affixed to cold plate base 620 of the heat sink. Note that in FIG. 6I, only the coiled actuator 633 is shown disposed within and is closely sized to the respective valve well of the cold plate base 620.

Referring to FIGS. 6G, 6H and 6I, and as described above, the coiled actuator is affixed or secured at one end, e.g., at the outer diameter, to the cold plate base, and at another end, for instance, at the inner diameter, to the valve disk, wherein heating or cooling of the actuator 633 will cause thermal expansion or contraction of the actuator, and thereby rotating of the valve disk with respect to the cold plate base. In one example, the thermal-sensitive actuator is a manganese-bronze alloy coil, with a CTE of $21.2 \times 10^{-6}$ mm/K, 0.125 mm in thickness, and 0.127 mm in height, coiled, for instance, 92 times for an overall length of 1.493 meters. The coil in this example would have an outer diameter 641 of approximately 30 mm, corresponding (in one embodiment) to the diameter of the disk 631, and the outer coil would be mechanically affixed to the cold plate base 620, as noted. The inner diameter 640 of the coiled actuator at 25° C. would be approximately 6.89 mm, and the end of the inner coil is mechanically affixed to a feature 638 on the valve disk 631. The assembled valve at 25° C. would be closed, as shown in FIG. 6E, and when heated to (for instance) 75° C., increases its length by approximately 1.59 mm, rotating the valve disk just over 24° (6.4 mm of arc length at the outside diameter of the disk), aligning the valve's coolant channel to the coolant-carrying channel of the cold plate base, and allowing maximum coolant flow across the valve and through the coolant-carrying channel.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method of fabricating a cooling apparatus comprising:
   providing a coolant-cooled heat sink, the coolant-cooled heat sink being configured to facilitate dissipation of heat generated by one or more electronic components, and comprising a thermally conductive element coupled to the one or more electronic components and defining, at least in part, a coolant-carrying channel, the thermally conductive element including a cylindrical-shaped bore intersecting the coolant-carrying channel and extending into the thermally conductive element towards the one or more electronic components; and
   providing a thermostat-controlled valve disposed, at least partially, within the cylindrical-shaped bore, the thermostat-controlled valve comprising:
      a valve disk rotatable between an open position where coolant is allowed to flow through the coolant-carrying channel, and a closed position where coolant is blocked from flowing through the coolant-carrying channel, the valve disk being a flat disk residing within the cylindrical-shaped bore and intersecting the coolant-carrying channel; and
      a thermal-sensitive actuator mechanically coupled to rotate the valve disk to rotate the valve disk between the open position and the closed position, dependent on heating of the thermal-sensitive actuator by the one or more electronic components, the thermal-sensitive actuator being disposed within the cylindrical-shaped bore in the thermally conductive element between the one or more electronic components and the coolant-carrying channel.

2. The method of claim 1, wherein the coolant-cooled heat sink is configured to couple to the one or more electronic components, and wherein the cylindrical-shaped bore with the thermostat-controlled valve disposed, at least partially, therein, is aligned over the at least one electronic component of the one or more electronic components.

3. The method of claim 1, wherein the coolant-cooled heat sink comprises a cold plate base and a cover, the cold plate base comprising the thermally conductive element, and wherein the valve disk and the thermal-sensitive actuator are both disposed within the cylindrical-shaped bore in the cold plate base, the thermal-sensitive actuator comprising a coiled actuator disposed within the cylindrical-shaped bore, below the coolant-carrying channel and the valve disk.

4. The method of claim 1, wherein the coolant-cooled heat sink comprises multiple coolant-carrying channels and multiple cylindrical-shaped bores intersecting the multiple coolant-carrying channels, each cylindrical-shaped bore intersecting a respective coolant-carrying channel of the multiple coolant-carrying channels; and
   wherein the method further comprises providing multiple thermostat-controlled valves, each thermostat-controlled valve being disposed, at least partially, within a respective cylindrical-shaped bore of the multiple cylindrical-shaped bores, wherein the multiple thermostat-controlled valves separately control coolant flow through the multiple coolant-carrying channels of the coolant-cooled heat sink.

5. The method of claim 1, wherein the valve disk comprises a coolant channel extending thereacross, and wherein in the open position, the coolant channel of the valve disk substantially aligns to an axis of the coolant-carrying channel of the coolant-cooled heat sink, and in the closed position, the coolant channel of the valve disk is rotated away from and misaligned to the axis of the coolant-carrying channel of the coolant-cooled heat sink.

6. The method of claim 1, wherein the valve disk and defines a variable coolant flow cross-sectional opening with reference to the coolant-carrying channel, dependent on the rotational orientation thereof, as controlled by the thermal-sensitive actuator.

7. The method of claim 1, wherein the thermal-sensitive actuator comprises a coiled actuator disposed within the cylindrical-shaped bore, below the coolant-carrying channel and the valve disk, the coiled actuator being secured at one end to the coolant-cooled heat sink, and at another end to the valve disk.

8. The method of claim 7, wherein the one end of the coiled actuator comprises an outer end at an outer diameter of the coiled actuator, and the another end of the coiled actuator comprises an inner end at an inner diameter of the coiled actuator.

9. The method of claim 7, wherein the coiled actuator comprises a coiled foil material with an uncoiled length greater than one meter.

10. The method of claim 1, wherein the thermal-sensitive actuator comprises a coiled actuator fabricated of a manganese-bronze alloy.

* * * * *